United States Patent
King et al.

[11] Patent Number: 5,952,132
[45] Date of Patent: Sep. 14, 1999

[54] METHOD FOR FORMING A STEPPER FOCUS PATTERN THROUGH DETERMINATION OF OVERLAY ERROR

[75] Inventors: Mingchu King; Shih-Shiung Chen, both of Hsin-Chu, Taiwan

[73] Assignee: Taiwan Semiconductor Mfg. Co., Hsin-Chu, Taiwan

[21] Appl. No.: 08/928,569

[22] Filed: Sep. 12, 1997

[51] Int. Cl.⁶ .................................................. G03F 9/00
[52] U.S. Cl. ................................................ 430/22; 430/30
[58] Field of Search .......................................... 430/22, 30

[56] References Cited

U.S. PATENT DOCUMENTS 5,635,336   6/1997   Bae ............................................ 430/22
5,665,495   9/1997   Hwang ...................................... 430/22

Primary Examiner—Christopher G. Young
Attorney, Agent, or Firm—Tung & Associates

[57] ABSTRACT

The present invention discloses a method for forming a pattern for stepper focus which can be monitored by overlay measurements such that a focal plane can be advantageously and accurately determined without human reading errors that are normally observed in conventional methods. The method for forming a stepper focus pattern for determining a focus error can be carried out by using an inner box and an outer box alignment marks and determining the shift in the center point of the two boxes as the overlay error.

14 Claims, 3 Drawing Sheets

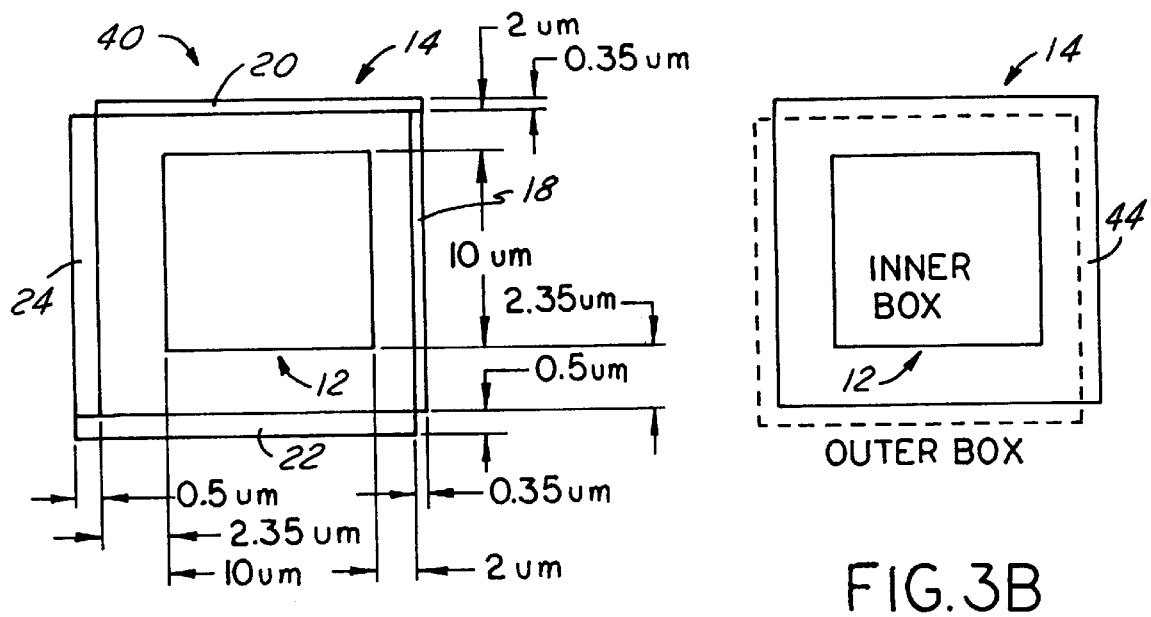
FIG.3A
FIG.3B
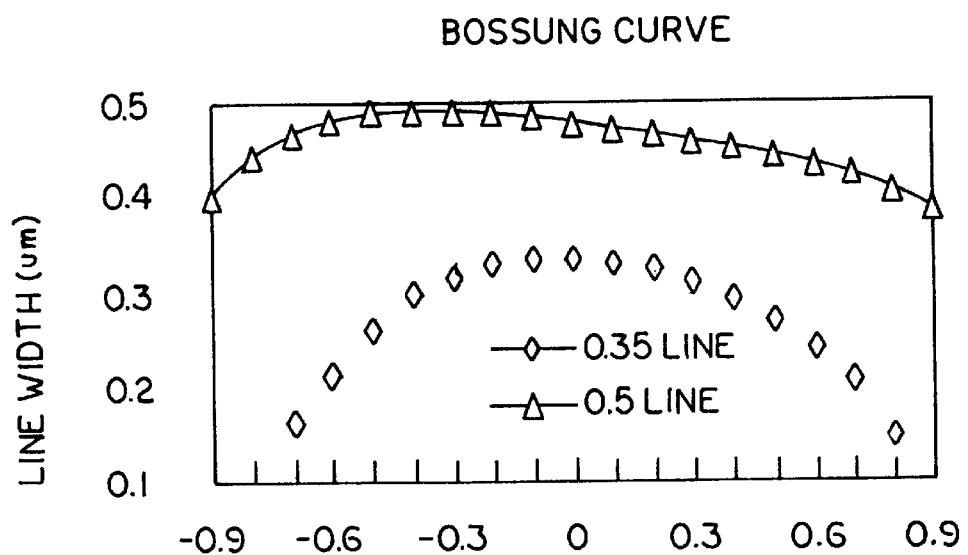
FIG.4

METHOD FOR FORMING A STEPPER FOCUS PATTERN THROUGH DETERMINATION OF OVERLAY ERROR

FIELD OF THE INVENTION

The present invention generally relates to a method for focusing an image in a photolithographic process and more particularly, relates to a method for forming a pattern for stepper focus that is monitored by overlay measurements such that a focal plane can be determined accurately without human reading errors.

BACKGROUND OF THE INVENTION

In recent years, advanced micro-electronic devices are fabricated with very large scale integration (VLSI) or ultra large scale integration (ULSI) techniques such that extremely complex electrical circuits can be fabricated onto a very small chip. The large reduction in size of the micro-electronic devices requires the development of new design and manufacturing technologies to accomplish the miniaturization of such semiconductor devices. One of the critical fabrication steps for the micro-electronic devices is the photolithographic process in which a pattern of the circuits in a microscopic scale is transferred from a photomask onto a wafer surface such that the circuits are reproduced on the wafer.

A typical photolithographic process utilizes a step-and-repeat process to gradually transfer a mask pattern to a chip implementation on a microscopic scale. The process involves many individual steps of reductions wherein errors may be introduced into the final mask. For instance, in such a micro-lithography process, problems exist in the accurate measurement of overlay which is an indication of the degree of misalignment between successive layers of patterns on a semiconductor wafer surface and of the alignment of a mask/reticle pattern for printing such layers to preceding layers. In conducting lithography on such a microscopic scale, the capability of making an accurate measurement of overlay is a critical requirement of the process.

In a conventional method for measuring overlay and for aligning the wafers, a global alignment method and global alignment marks are frequently utilized wherein alignment marks are patterned by an independent process layer and then all the other device process layers are aligned to the alignment marks. For the device layers, the degree of overlay shift (or error) can be measured by specifically designed measurement patterns from both successive and preceding layers formed by scribe lines for checking the overlay. However, as the device dimensions continue to become miniaturized, the accuracy achieved by a conventional method for overlay measurement becomes inadequate due to its poor resolution and accuracy. For instance, in a 0.25 $\mu$m design rule, the overlay specification must be in the range of approximately 0.025 $\mu$m. The microscopic measurements should be conducted by a SEM (scanning electronic microscopy) or AFM (atomic force microscopy) method in order to verify the overlay accurately.

In the conventional measurement techniques, a wafer overlay measurements can be conducted by a box-in-box or critical dimension (CD) technique in which tests mask targets are placed at different areas of the wafer surface. For instance, the test targets can be laid out in the peripheral regions on a wafer surface. The measurements are then conducted to verify the accuracy of the circuit lay out by comparing shifts in the box center lines to a process average. With the conventional techniques, an accurate wafer dimensional quality determination cannot be made until box-in-box targets are made on an appropriate number of cells within a circuit. Furthermore, in the conventional measurement techniques, by using a stepper machine, a focal plane of the stepper is determined manually by technicians by visually reading exposed 0.6 $\mu$m focus matrix dots. The process is repeated until a satisfactory focal plane is determined as the center of focus when a good resolution of the 0.6 $\mu$m dots is obtained. The disadvantages of this technique is the large focus error caused by the manual reading taken by different technicians. A typical accuracy that can be obtained with this method is 0.2 $\mu$m which is inadequate for the mass production of sub-half micron technology devices.

It is therefore an object of the present invention to provide a pattern for stepper focus that is monitored by an overlay measurement without the drawbacks and shortcomings of the conventional methods.

It is another object of the present invention to provide a method for forming a stepper focus pattern that can be monitored by an overlay measurement and be suitably used in the mass production of sub-half micron technology devices.

It is a further object of the present invention to provide a method for forming a stepper focus pattern that can be used to accurately measure a misalignment that is sensitive to focus change.

It is still another object of the present invention to provide a method for forming a stepper focus pattern for determining a focal plane accurately and for reducing the focus error caused by a manual reading method.

It is yet another object of the present invention to provide a method for forming a stepper focus pattern in which a plot of the overlay values versus the focus lengths can be obtained to produce a focal plane by an overlay value calculated.

It is another further object of the present invention to provide a method for forming a stepper focus pattern in which a formula is provided for the accurate determination of an overlay error between an inner box and an outer box alignment marks.

SUMMARY OF THE INVENTION

In accordance with the present invention, a method for forming a stepper focus pattern for determining a focus error between an inner box and an outer box alignment marks is provided.

In a preferred embodiment, a method for forming a stepper focus pattern for the accurate determination of a focus error can be carried out by the operating steps of first providing an inner box as a central reference point, then providing a first plurality of peripheral sections having a first width of $L_a$ positioned concentrically around the inner box, then providing a second plurality of peripheral sections having a second width of $L_b$ positioned concentrically around the inner box wherein said first and said second plurality of peripheral sections forming an outer box, and then calculating an overlay error (OV) between the inner box and the outer box by the equation of:

$$OV = \frac{1}{4}(L_a(F) + L_b(F)) - \frac{1}{4}(L_a + L_b).$$

Wherein $L_a$ (F) and $L_b$ (F) are functions of the focus length.

In the preferred embodiment, the inner box utilized is substantially of a square shape while the plurality of peripheral sections are generally of elongated rectangular shapes.

The second width of the second plurality of peripheral sections is generally larger than the first width of the first plurality of peripheral sections. The first plurality of peripheral sections can be provided as two elongated rectangular sections arranged perpendicular to each other, while the second plurality of peripheral sections can be arranged as two elongated rectangular sections perpendicular to each other and positioned opposite to the first plurality of peripheral sections surrounding the inner box. In the preferred embodiment, the inner box has a width between about 8 $\mu$m and about 12 $\mu$m, the first plurality of peripheral sections has a width in the range between about 0.25 $\mu$m and about 0.45 $\mu$m, the second plurality of peripheral sections has a width in the range of between about 0.4 $\mu$m and about 0.6 $\mu$m. The first and the second plurality of peripheral sections are arranged parallel to and spaced apart from the two adjoining sides of the inner box at a distance between about 1.5 $\mu$m and about 3.0 $\mu$m.

In another preferred embodiment, the method may further include the steps of plotting an overlay value versus focus length curve and then predicting a focal plane by the overlay value calculated. In still another preferred embodiment, the method may further include the step of predicting a zero focus point.

BRIEF DESCRIPTION OF THE DRAWINGS

These and other objects, features and advantages of the present invention will become apparent from the following detailed description and the appended drawings in which:

FIGS. 3A and 3B are enlarged, plane views of an example of the present invention stepper focus pattern with predetermined line widths and spacings from the inner box.

FIG. 4 is a graph of line widths plotted against the focus lengths for a 0.35 $\mu$m line and a 0.5 $\mu$m line.

DETAILED DESCRIPTION OF THE PREFERRED EMBODIMENT

The present invention provides a method for forming a stepper focus pattern that can be used accurately to provide a graph of an overlay error plotted against focus length and then using the curve to locate a focal plane by measuring an overlay error from a specifically designed pattern. The overlay error between an inner box and an outer box can be calculated by the equation of:

$$OV = \frac{1}{4}(L_a(F)+L_b(F)) - \frac{1}{4}(L_a+L_b).$$

Figure 1:
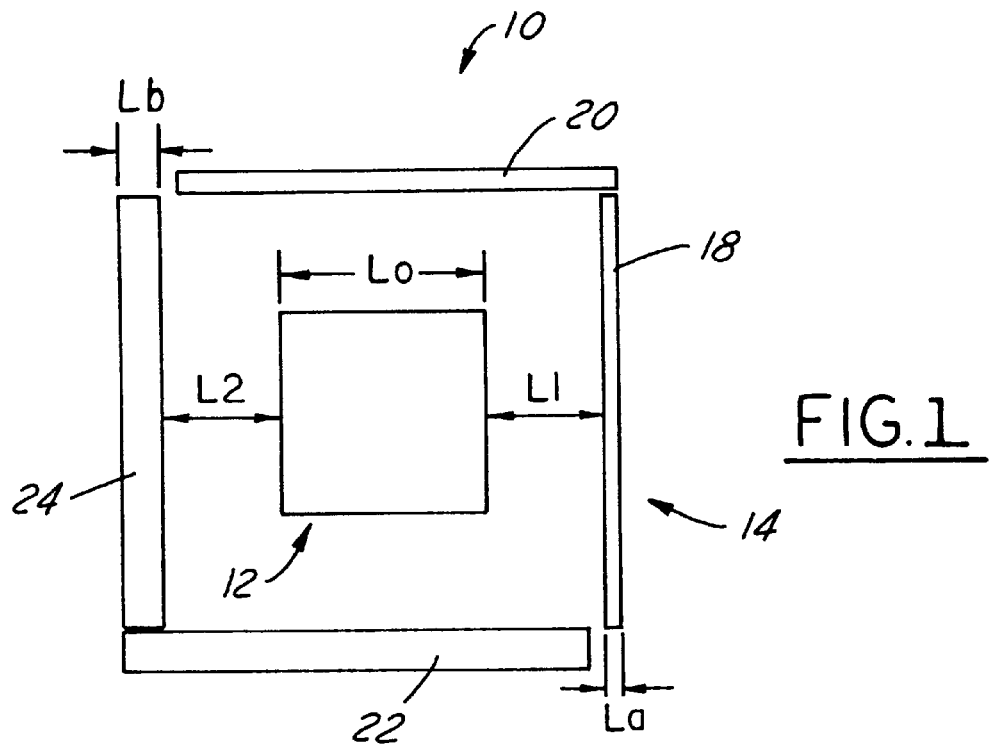
FIG. 1 is an enlarged, plane view of a present invention stepper focus pattern consisting of an inner box and an outer box.

Referring initially to FIG. 1 wherein an enlarged, plane view of a present invention stepper focus pattern 10 is shown. Pattern 10 consists of an inner box 12 and an outer box 14. The inner box 12 can be conveniently laid out as a square having a width of $L_0$. The outer box 14 consists of a first plurality of peripheral sections 18 and 20 which are of equal width of $L_a$. The sections 14 and 20 are positioned concentrically around the inner box 12 at an equal distance of $L_1$ from the inner box 12. The outer box 14 further consists of a second plurality of peripheral sections 22 and 24 which are of equal width of $L_b$. The sections 22 and 24 are positioned concentrically around the inner box 12 opposite to the first plurality of peripheral sections 14 and 20. The sections 22 and 24 are each positioned at an equal distance $L_2$ from the inner box 12. The second plurality of peripheral sections 22, 24 together with the first plurality of peripheral sections 18 and 20 forms an outer box 14.

In a typical box-in-box arrangement 10 shown in FIG. 1, the distance $L_2$ is equal to the sum of the distance $L_1$ and the width $L_a$. Assuming $L_a$ (F) and $L_b$ (F) are functions of the focus length (F) and have values deviate from its original photomask values. An overlay error (or shift) of a pattern from its original zero error position can be calculated from the following equations:

$$OV = ((\tfrac{1}{2}L_0 + L_1 + \tfrac{1}{2}L_a + \tfrac{1}{2}L_a(F)) - (\tfrac{1}{2}L_0 + L_2 + \tfrac{1}{2}L_b - \tfrac{1}{2}L_b(F)))/2$$

$$= (L_1 - L_2 + \tfrac{1}{2}L_a - \tfrac{1}{2}L_b + \tfrac{1}{2}(L_a(F) + L_b(F)))/2$$

$$= \tfrac{1}{4}(L_a(F) + L_b(F)) - \tfrac{1}{4}(L_a + L_b)$$

Figure 2A:
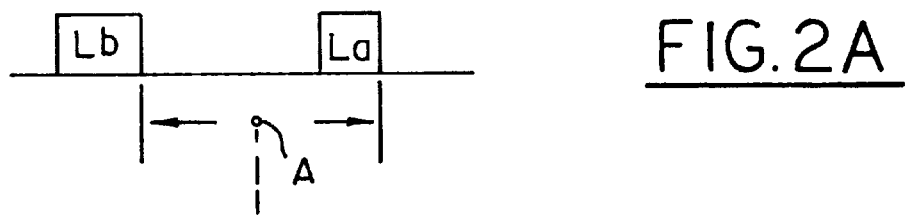
FIGS. 2A and 2B are cross-sectional views of two peripheral sections illustrating a line width change and an overlay error.
Figure 2B:
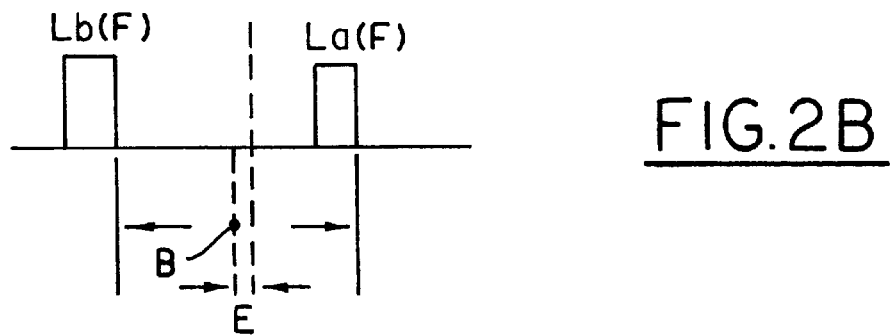

To illustrate ant overlay error from its original center position, FIG. 1 shows a cross-sectional view of two peripheral sections illustrating a line width change and an overlay error of E. In FIG. 2A, the original box center is the center point between edge 28 and edge 32 respectively of the two peripheral sections 18 and 24. In FIG. 2B, the center has shift from a to b indicating an overlay error of E. Furthermore, the width of section 18 has changed from $L_a$ to $L_a$ (F), while the width of section 24 has changed from $L_b$ to $L_b$ (F). $L_a$ (F) and $L_b$ (F) are functions of the focus length F. The values of $L_a$ (F) and $L_b$ (F) can be advantageously determined by a scanning electron microscopy method or by an atomic force microscopy method on a wafer surface. The overlay error OV can then be determined by the equation shown above since $L_a$ and $L_b$ are known values from the photomask specification.

Referring now to FIGS. 3A and 3B, wherein enlarged, plane views of an example for the present invention stepper focus pattern 40 is shown. The stepper focus pattern 40 has a predetermined line width of 0.35 $\mu$m for sections 18 and 20, and a predetermined line width of 0.5 $\mu$m for sections 22 and 24. The inner box 12 has a width of 10 $\mu$m ($L_0$). The spacings between sections 18, 20 from the inner box 12 is 2 $\mu$m ($L_1$) The spacing between sections 22 and 24 and the inner box 12 is 2.35 $\mu$m ($L_2$). These are shown in FIG. 3A. FIG. 3B shows a projected view from FIG. 3A indicating an inner box 12 and an outer box 14 and a shifted outer box 44 (in dash line). It is seen that the shifted outer box 44 is formed by the $L_a$ (F) and $L_b$ (F) which are functions of the focus length that have deviated from zero overlay error.

The present invention novel method enables a graph of line width plotted against the focus length, as shown in FIG. 4 to be made by measuring the resist line width change with focus lengths. As shown in FIG. 4, the lower curve indicates the line width change for the 0.35 $\mu$m resist line while the upper curve indicates the line width change for the 0.5 $\mu$m resist line at various focus lengths.

Figure 5:
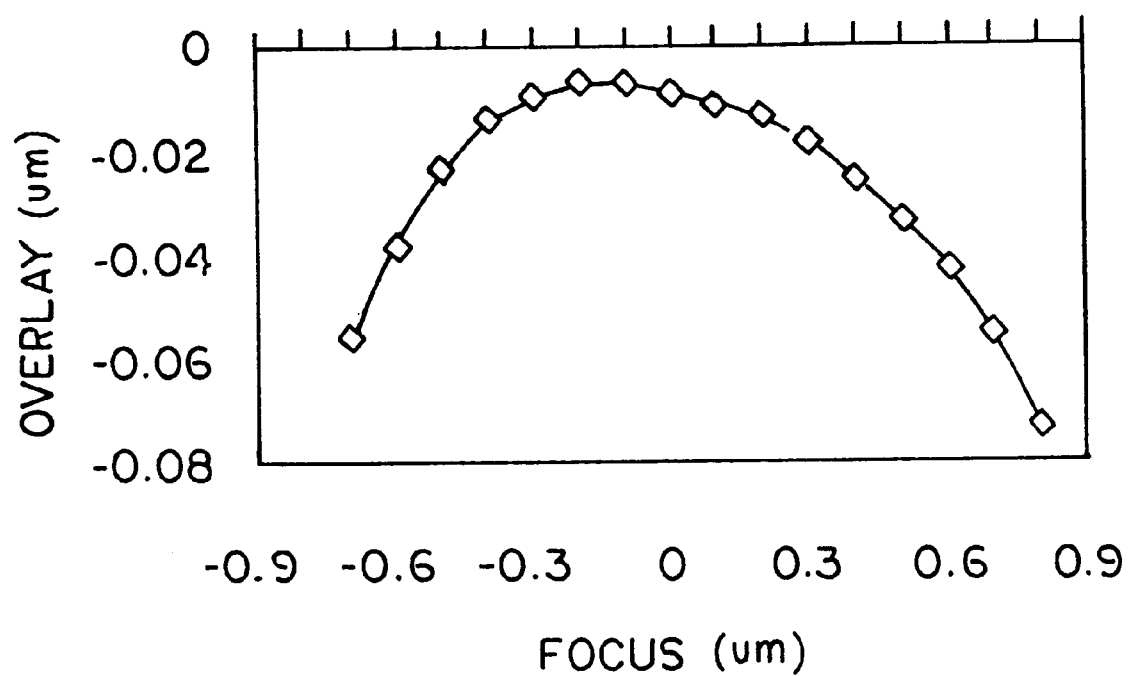
FIG. 5 is a graph illustrating the overlay errors plotted against focus lengths by the present invention method.

By measuring the overlay error at different focus lengths, a graph illustrating the overlay errors plotted against the focus lengths is shown in FIG. 5. From this curve of overlay error vs. focus length, the present invention novel method enables the measurement of an overlay change that is based on the focus length chance. The point of the best focus can then be advantageously determined from the curve. Based on the overlay error chance, the location of the focus zero can be determined.

In the preferred embodiment shown in FIGS. 3A and 3B, the inner box 12 has a width between about 5 $\mu$m and about 30 μm, and preferably a width of about 10 μm. The first plurality of peripheral sections 18 and 20 has a width in the range between about 0.20 μm and about 0.6 μm, and preferably at about 0.35 μm. The second plurality of peripheral sections 22, 24 has a width in the range between about 0.35 μm and about 1.0 μm, and preferably at about 0.5 μm. The first and the second plurality of peripheral sections, 18, 20, 22 and 24 are arranged parallel to and spaced apart from the two adjoining sides of inner box 12 at a distance of between about 1.5 μm and about 5 μm.

The present invention novel method therefore allows for the formation of a stepper focus pattern for determining a focus error between an inner box and an outer box alignment marks such that a focal plane can be advantageously and accurately determined without human reading errors. A typical accuracy that can be obtained by the present invention novel method can be adequately used in the mass production of sub-half micron technology devices.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined in the following claims:

1. A method for forming a stepper focus pattern for determining a focus error comprising the steps of:

providing an inner box as a central reference point, providing a first plurality of peripheral sections having a first width of $L_a$ positioned concentrically around said inner box, providing a second plurality of peripheral sections having a second width of $L_b$ positioned concentrically around said inner box, said first and second plurality of peripheral sections forming an outer box, said outer box being positioned concentrically around said inner box, and calculating an overlay error (OV) between said inner box and said outer box by the equation of:

$$OV = (L_1 - L_2 + \tfrac{1}{2}L_a - \tfrac{1}{2}L_b + \tfrac{1}{2}(L_a(F) + L_b(F))/2$$
$$= \tfrac{1}{4}(L_a(F) + L_b(F)) - \tfrac{1}{4}(L_a + L_b)$$

wherein $L_a(F)$ and $L_b(F)$ are functions of focus length, $L_1$ is the distance between said first plurality of peripheral sections and said inner box, $L_2$ is the distance between said second plurality of peripheral sections and said inner box, the distance $L_2$ being equal to the sum of the distance $L_1$ and the width $L_a$ of said first plurality of peripheral sections.

2. A method according to claim 1, wherein said inner box is substantially of a square shape.

3. A method according to claim 1, wherein said first plurality of peripheral sections are generally of elongated rectangular shape.

4. A method according to claim 1, wherein said second plurality of peripheral sections are generally of elongated rectangular shape.

5. A method according to claim 1, wherein said second width of said second plurality of peripheral sections is larger than said first width of said first plurality of peripheral sections.

6. A method according to claim 1, wherein said first plurality of peripheral sections comprises two rectangular sections arranged perpendicular to each other.

7. A method according to claim 1, wherein said second plurality of peripheral sections comprises two rectangular sections arranged perpendicular to each other and positioned opposite to said first plurality of peripheral sections surrounding said inner box.

8. A method according to claim 1, wherein said first width for said first plurality of peripheral sections is in the range between about 0.2 μm and about 0.6 μm.

9. A method according to claim 1, wherein said second width for said second plurality of peripheral sections is in the range between about 0.35 μm and about 1.0 μm.

10. A method according to claim 1, wherein said inner box has a width between about 5 μm and about 30 μm.

11. A method according to claim 1, wherein said first plurality of peripheral sections are arranged parallel to and spaced apart from two adjoining sides of said inner box at a distance between about 1.5 μm and about 2.5 μm.

12. A method according to claim 1, wherein said second plurality of peripheral sections are arranged parallel to and spaced apart from two adjoining sides of said inner box at a distance between about 1.5 μm and about 5 μm.

13. A method according to claim 1 further comprising the steps of:

plotting an overlay versus focus length curve, and
   producing a focal plane by the OV value calculated.

14. A method according to claim 1 further comprising the step of predicting the zero focus plane.

* * * * *